(12) United States Patent
Lee

(10) Patent No.: US 7,271,091 B2
(45) Date of Patent: Sep. 18, 2007

(54) METHOD FOR FORMING METAL PATTERN TO REDUCE CONTACT RESISTIVITY WITH INTERCONNECTION CONTACT

(75) Inventor: Date-Gun Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 206 days.

(21) Appl. No.: 11/024,467

(22) Filed: Dec. 30, 2004

(65) Prior Publication Data
US 2005/0142841 A1 Jun. 30, 2005

(30) Foreign Application Priority Data
Dec. 31, 2003 (KR) .................. 10-2003-0101907

(51) Int. Cl.
*H01L 21/4763* (2006.01)

(52) U.S. Cl. .................. 438/640; 438/637; 438/639; 438/652; 438/675

(58) Field of Classification Search .................. None
See application file for complete search history.

(56) References Cited

U.S. PATENT DOCUMENTS 5,904,559 A * 5/1999 Yu .................. 438/638
6,228,763 B1 * 5/2001 Lee .................. 438/639
6,475,904 B2 * 11/2002 Okoroanyanwu et al. ... 438/637
6,893,541 B2 * 5/2005 Chiang et al. ......... 204/192.17

FOREIGN PATENT DOCUMENTS

JP 2000-174117 6/2000

* cited by examiner

*Primary Examiner*—Mary Wilczewski
*Assistant Examiner*—Khanh Duong
(74) *Attorney, Agent, or Firm*—Lowe Hauptman & Berner LLP

(57) ABSTRACT

A method for forming a metal pattern in a semiconductor device which is capable of reducing contact resistivity with an interconnection contact. The method includes forming a tungsten interconnection contact passing through a lower insulating layer on a semiconductor substrate, forming an upper insulating layer covering the interconnection contact, and forming a groove having the same line width as a damascene trench on the upper insulating layer. The method also includes forming a mask spacer on a sidewall of the groove, forming the damascene trench having an inclined bottom profile for exposing a top surface and a portion of a sidewall of the interconnection contact, and forming a metal pattern with which the damascene trench is filled, the metal pattern electrically connected to the interconnection contact.

6 Claims, 4 Drawing Sheets

METHOD FOR FORMING METAL PATTERN TO REDUCE CONTACT RESISTIVITY WITH INTERCONNECTION CONTACT

BACKGROUND OF THE INVENTION (a) Field of the Invention

The present invention relates to a method for fabricating a semiconductor device, and more particularly to a method for forming a metal pattern in a semiconductor device.

(b) Description of the Related Art

As the degree of integration of semiconductor devices is increasing and performance of semiconductor devices is highly enhanced, reduction of contact resistivity when an interconnection contact is connected to a metal pattern, which is an interconnection provided above the interconnection contact, has become as a significant issue.

In fabricating a semiconductor device, a copper interconnection is used to reduce interconnection resistivity. A damascene process is used to form the copper interconnection. In addition, a tungsten (W) contact having relatively low resistivity is used as the interconnection contact in order to reduce the contact resistivity.

FIG. 1 is a schematic sectional view illustrating a method for forming a metal pattern in a related art semiconductor device.

Referring to FIG. 1, transistor elements are formed on a semiconductor substrate 10. A device isolation film 15 is formed, for example by shallow trench isolation (STI), on the semiconductor substrate 10. A gate oxide film 21 and a gate 23 are formed on a device region. A buffer layer 25 is formed on a sidewall of the gate 23, and a sidewall spacer 27 is formed on the buffer layer 25. Source/drain regions 31 are formed in the vicinity of gate 23 on the semiconductor substrate 10. A metal silicide layer 29 for resistivity reduction is formed on the gate 23. A metal silicide layer 35 is formed on the source/drain regions 31.

A first lower insulating layer 41 having a liner shape is formed covering the above transistor structure. A second lower insulating layer 43 and a third lower insulating layer 45 are sequentially stacked on the first lower insulating layer 41 to implement an insulating layer structure.

An interconnection contact 55 electrically connected to the source/drain region 31 through the insulating layer structure is formed within a contact hole 47. The interconnection contact 55 is made of tungsten. A barrier metal layer 51 is formed with a Ti/TiN layer under the tungsten interconnection contact 55. In this case, the Ti layer has a thickness of about 300Å and the TiN layer has a thickness of about 50Å.

A first upper insulating layer 61 and a second upper insulating layer 63 covering the interconnection contact 55 are formed. Also, a metal pattern 75 of a copper interconnection contacting with a top surface of the interconnection contact 55 through the first upper insulating layer 61 and the second upper insulating layer 63 is formed by performing a single damascene process. A Ta/TaN layer having a thickness of 150 Å/ 150Å is formed as a barrier metal layer 71 under the metal pattern 75 of the copper interconnection.

The tungsten interconnection contact 55 contacts the metal pattern 75 of the copper interconnection with an unacceptably high contact resistivity. This is because the resistivity of tungsten is about four times as large as that of copper, which results in deterioration in the performance of the semiconductor device.

SUMMARY OF THE INVENTION

In considerations of the above problem, the present invention advantageously provides a method for forming a metal pattern in a semiconductor device, which is capable of reducing contact resistivity with an interconnection contact.

To achieve the object, according to an aspect of the present invention, there is provided a method for forming a metal pattern in a semiconductor device including forming an interconnection contact passing through a lower insulating layer on a semiconductor substrate, forming an upper insulating layer covering the interconnection contact, forming a groove having the same line width as a damascene trench on the upper insulating layer, forming a mask spacer on a sidewall of the groove, forming the damascene trench having an inclined bottom profile for exposing a top surface and a portion of a sidewall of the interconnection contact, and forming a metal pattern with which the damascene trench is filled, the metal pattern electrically connected to the interconnection contact.

In one exemplary embodiment, the step of forming a groove includes forming a photoresist pattern and forming a groove by etching the upper insulating layer using the photoresist pattern as an etch mask.

In one exemplary embodiment, the step of forming a mask spacer includes forming a spacer layer with a liner shape according to a profile of the groove, the spacer layer including a silicon oxide layer or a silicon nitride layer, and performing an anisotropic dry etching process for the spacer layer such that the spacer layer remains only on the sidewall of the groove.

In one exemplary embodiment, the interconnection contact includes a tungsten layer.

In one exemplary embodiment, the step of forming the metal pattern includes forming a copper layer filling the damascene trench and smoothing the copper layer.

In one exemplary embodiment, the step of forming a copper layer includes forming a barrier metal layer within the damascene trench, the barrier metal layer including a Ta/TaN layer covering an exposed portion of the interconnection contact, and forming a copper layer on the barrier metal layer, the copper layer including a seed layer.

With the present invention as configured above, a method for forming a metal pattern in a semiconductor device, which is capable of reducing contact resistivity with an interconnection contact, can be provided.

It is to be understood that both the foregoing general description of the invention and the following detailed description are exemplary, but are not restrictive of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

An exemplary embodiment of the present invention will now be described in detail with reference to the accompanying drawings. The following embodiments may be modified in various forms, but should not be interpreted to be limited thereto. The following embodiment is provided for sufficient understandings of the present invention by those skilled in the art.

FIGS. 2 to 8 are schematic sectional views illustrating a method for forming a metal pattern in a semiconductor device, which is capable of reducing contact resistivity with an interconnection contact, according to an embodiment of the present invention.

Figure 1:
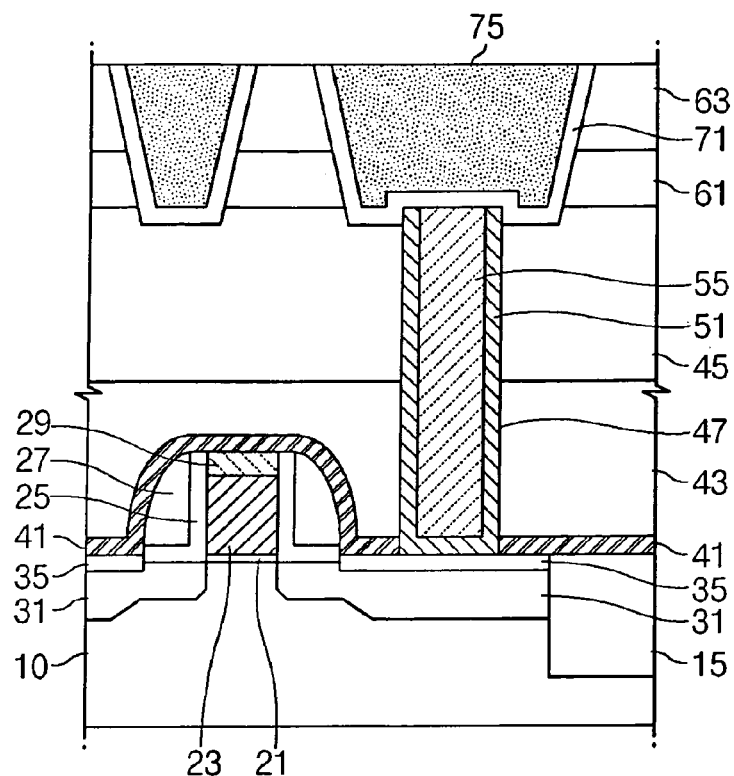
FIG. 1 is a schematic sectional view illustrating a method for forming a metal pattern in a related art semiconductor device.
Figure 2:
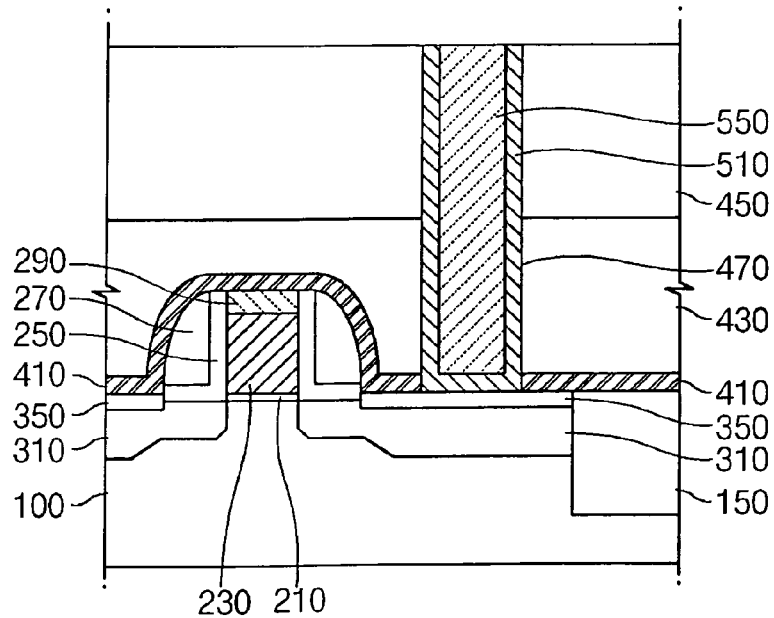
FIGS. 2 to 8 are schematic sectional views illustrating a method for forming a metal pattern in a semiconductor device, which is capable of reducing contact resistivity with an interconnection contact, according to an embodiment of the present invention.

Referring to FIG. 2, a method for forming a metal pattern in a semiconductor device according to the embodiment of the present invention is carried out according to a single damascene process. Transistor elements are formed on a semiconductor substrate 100. A device isolation film 150 is formed, by for example shallow trench isolation (STI), on the semiconductor substrate 100. A gate oxide film 210 and a gate 230 are formed on a device region of the semiconductor substrate 100. A buffer layer 250 made of an insulating material is formed on a sidewall of the gate 230. A sidewall spacer 270 is formed on the buffer layer 250.

Source/drain regions 310 are formed in the vicinity of gate 230 on the semiconductor substrate 100. A metal silicide layer 290 for resistivity reduction is formed on the gate 230. A metal silicide layer 350 is formed on the source/drain regions 310.

The metal silicide layers 310 and 350 may be formed with a conductive material such as a titanium silicide layer, according to a self-aligned silicide process.

A first lower insulating layer 410 of a liner shape is formed covering the above transistor structure. A second lower insulating layer 430 and a third lower insulating layer 450 are sequentially stacked on the first lower insulating layer 410 to implement an insulating layer structure. These lower insulating layers 410, 430 and 450 may be formed as an insulating layer structure made of an insulating material having a low dielectric constant.

An interconnection contact 550 electrically connected to the source/drain region 310 through the insulating layer structure is formed within a contact hole 470. The interconnection contact 550 may be made of tungsten. A barrier metal layer 510 is formed under the interconnection contact 550. The barrier metal layer 510 may be formed with a Ti/TiN layer. In this case, the Ti layer may have a thickness of about 300Å and the TiN layer may have a thickness of about 50Å.

Figure 3:
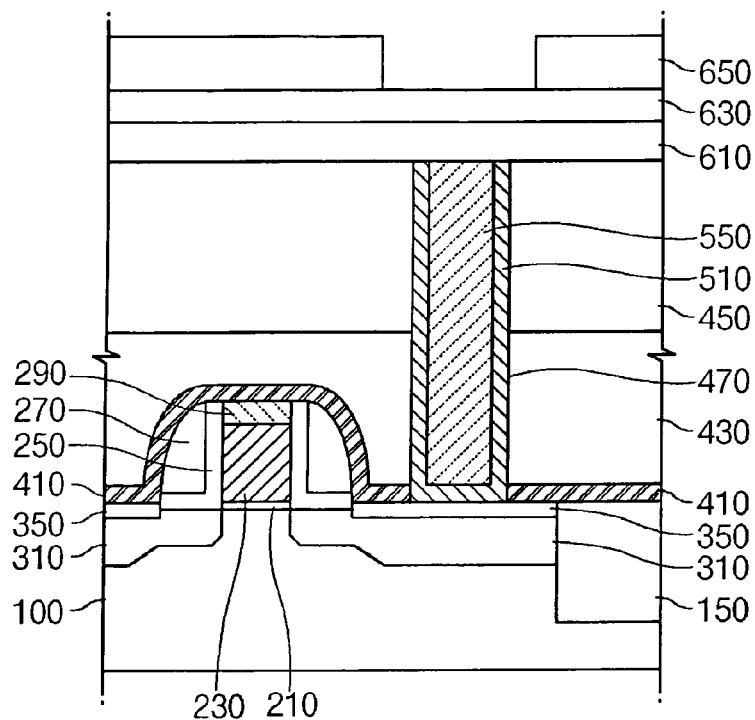

Referring to FIG. 3, a first upper insulating layer 610 and a second upper insulating layer 630 covering the interconnection contact 550 are formed. Thereafter, a photoresist pattern 650 for a damascene trench is formed. The photoresist pattern 650 may be used for patterning of a copper interconnection in the single damascene process.

Figure 4:
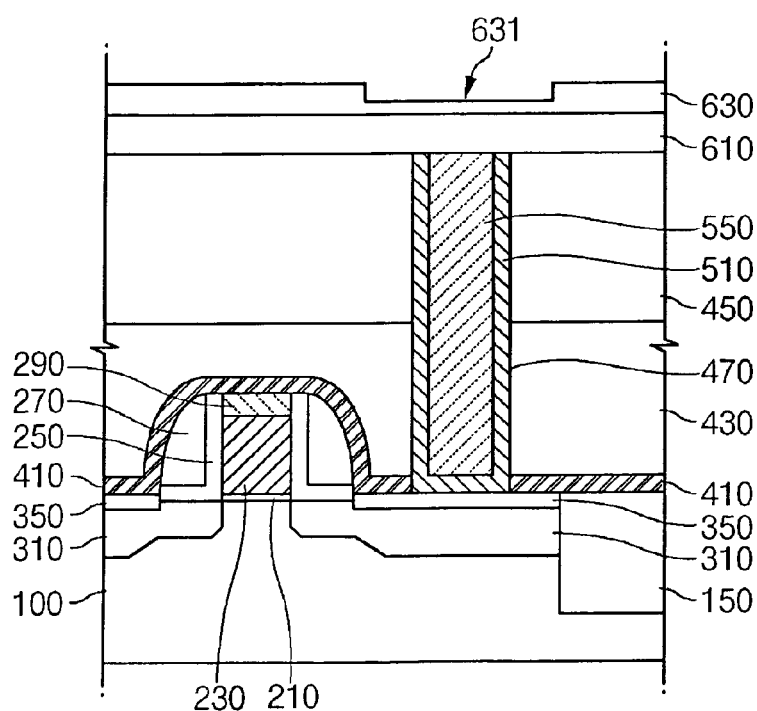

Referring to FIG. 4, a recessed groove 631 is formed by etching a portion of the second upper insulating layer 630 using the photoresist pattern 650. The groove 631 may be formed at a depth of about 500Å. Thereafter, the photoresist pattern is removed.

Figure 5:
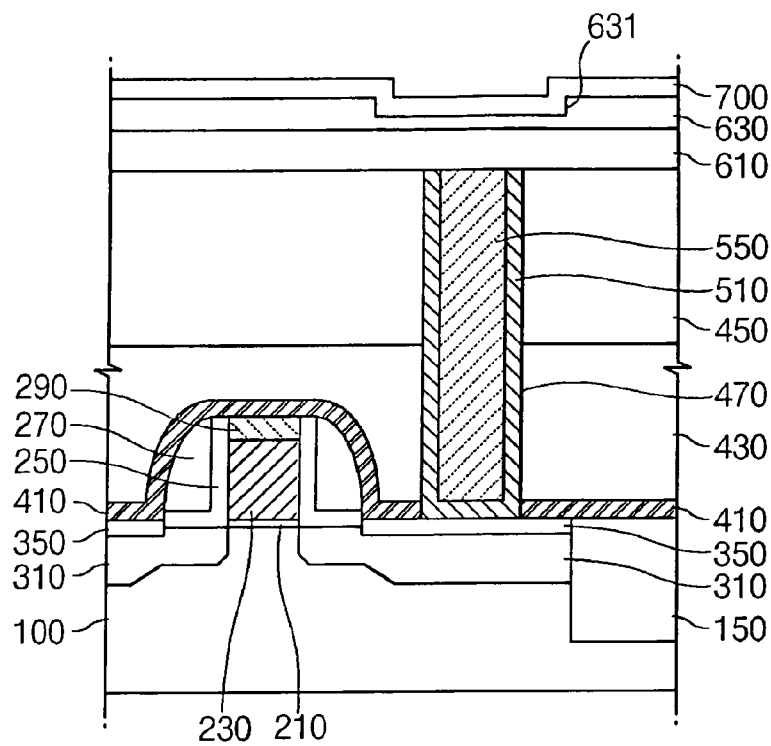

Referring to FIG. 5, a mask spacer layer 700 is formed according to a profile of the groove 631. The mask spacer layer 700 has a liner shape and may be formed with a thickness of about 200Å. The mask spacer layer 700 may be formed of silicon oxide or silicon nitride.

The thickness of the mask spacer layer 700 depends on a difference in line width between a damascene trench to be formed and the interconnection contact 550. As described above, when the mask spacer layer 700 is formed with a thickness of about 200Å, the line width of the damascene trench is 0.23 μm and the line width of the interconnection contact 550 is about 0.17 μm.

Figure 6:
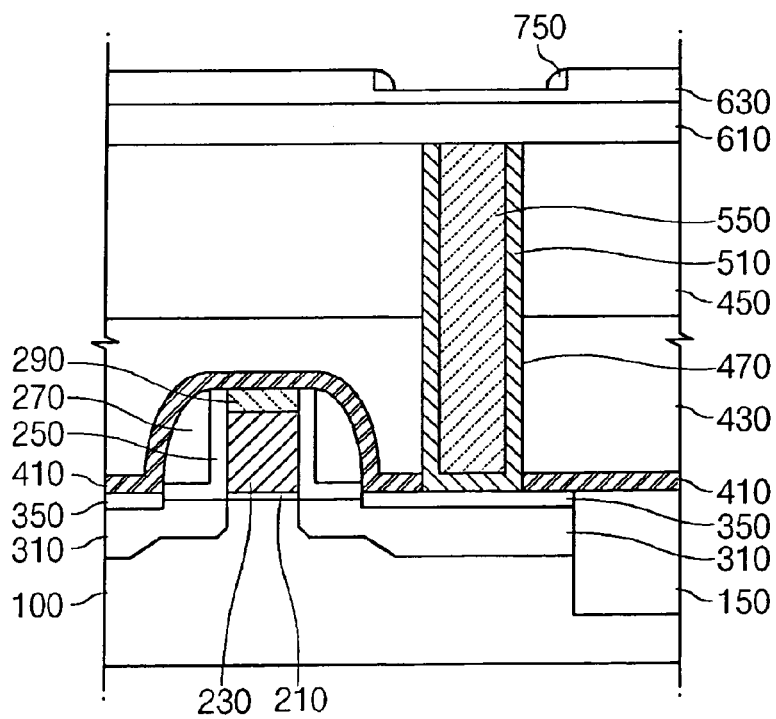

Referring to FIG. 6, a mask spacer 750 is formed adhered to the sidewall of the groove 631 by performing an anisotropic etching process on the mask spacer layer 700.

Figure 7:
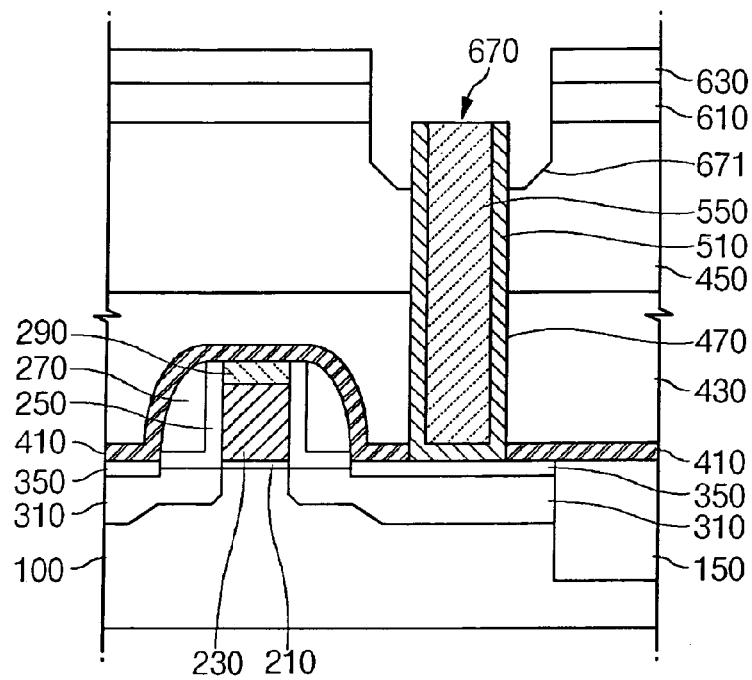

Referring to FIG. 7, with the mask spacer 750 formed, the interconnection contact 550 is exposed by patterning the second upper insulating layer 630 and the first upper insulating layer 610 using a single damascene process. A photoresist pattern having the same line width as the photoresist pattern 630 in FIG. 3 may be used as an etch mask.

As an etching process for forming the damascene trench 670 proceeds, the damascene trench 670 is formed with a wedged bottom profile due to the mask spacer 750. This exposes a sidewall of the interconnection contact 550, as shown in FIG. 7. The bottom of the damascene trench 670 has an inclined shape, thus exposing the sidewall of the interconnection contact 550 in a more expanded way.

Figure 8:
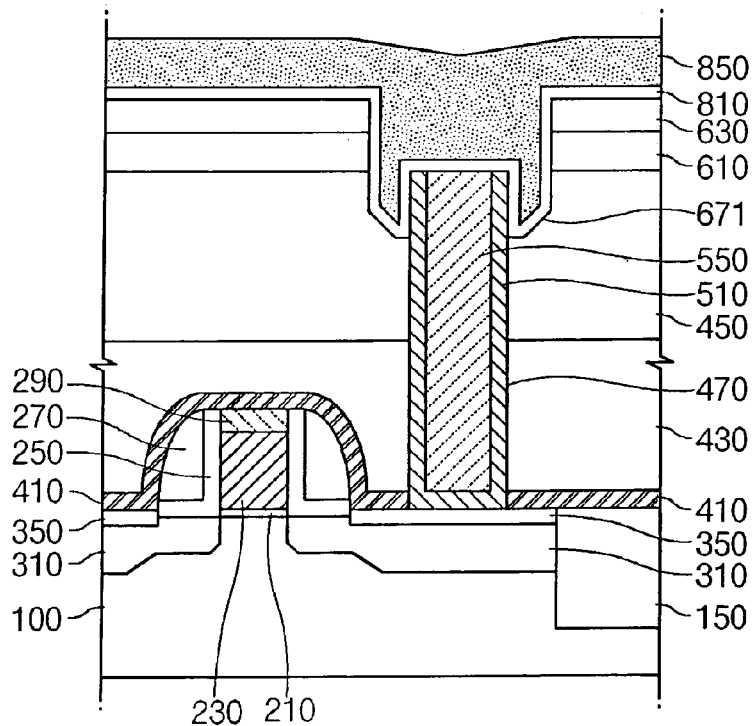

Referring to FIG. 8, a barrier metal layer 810 may be formed with a Ta/TaN layer having a thickness 150 Å/150 Å. A copper (Cu) seed layer (not shown) may be formed thereon. An upper metal layer 850 may be formed by an electroplating process and may be smoothed by a CMP process to thereby complete a metal pattern of a copper interconnection.

As is apparent from the above description, the copper interconnection with which the damascene trench is filled can contact the tungsten interconnection contact across a wider contact area. Accordingly, since the contact resistivity between the copper interconnection and the tungsten interconnection contact can be reduced, performance of devices can be improved and the devices can be operated with reduced power.

Korean Patent Application No. 10-2003-0101907, filed on Dec. 31, 2003, is hereby incorporated by reference in its entirety.

Although the preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for forming a metal pattern in a semiconductor device, comprising the steps of:

forming an interconnection contact passing through a lower insulating layer on a semiconductor substrate;

forming an upper insulating layer covering the interconnection contact;

forming a first photoresist pattern on the upper insulating layer;

forming a groove having a same line width as a damascene trench by etching a portion of the upper insulating layer using the first photoresist pattern as an etch mask, the groove comprising two sidewalls and a depth less than a thickness of the upper insulating layer;

forming a spacer layer with a liner shape according to a profile of the groove, the spacer layer being formed out of a same material as the upper insulating layer;

forming a pair of spacers on both sidewalls of the groove by performing an anisotropic dry etching process on the spacer layer;

forming a second photoresist pattern on the upper insulating layer, the second photoresist pattern having the same line as the first photoresist pattern;

forming the damascene trench by etching the pair of spacers, the upper insulating layer and a portion of the lower insulating layer using the second photoresist pattern as an etch mask, wherein the damascene trench comprises a substantially inclined bottom surface for exposing a top surface and portions of both sidewalls of the interconnection contact; and forming a metal pattern with which the damascene trench is filled, wherein the metal pattern is electrically connected to the interconnection contact.

2. The method of claim 1, wherein the upper insulating layer and spacer layer are formed of a silicon oxide or a silicon nitride material.

3. The method of claim 1, wherein the step of forming an interconnection contact includes forming the interconnection contact with a tungsten layer.

4. The method of claim 3, wherein the step of forming the metal pattern includes: forming a copper layer filling the damascene trench; and smoothing the copper layer.

5. The method of claim 4, wherein the step of forming a copper layer includes: forming a barrier metal layer within the damascene trench, the barrier metal layer including a Ta/TaN layer covering an exposed portion of the interconnection contact; and forming the copper layer on the barrier metal layer, the copper layer including a seed layer.

6. A method for forming a metal pattern in a semiconductor device, comprising:

forming an interconnection contact passing through a lower insulating layer on a semiconductor substrate;

forming an upper insulating layer covering the interconnection contact;

forming a first photoresist pattern on the upper insulating layer;

forming a groove having a same line width as a damascene trench by etching a portion of the upper insulating layer using the first photoresist pattern as an etch mask, the groove comprising two sidewalls and a depth less than a thickness of the upper insulating layer;

forming a spacer layer with a liner shape according to a profile of the groove, the spacer layer being formed out of a same material as the upper insulating layer;

forming a pair of spacers on both sidewalls of the groove by performing an anisotropic dry etching process on the spacer layer;

forming a second photoresist pattern on the upper insulating layer, the second photoresist pattern having the same line as the first photoresist pattern;

forming the damascene trench by etching the pair of spacers, the upper insulating layer and a portion of the lower insulating layer using the second photoresist pattern as an etch mask, wherein the damascene trench comprises a substantially inclined bottom surface for exposing a top surface and portions of both sidewalls of the interconnection contact; and forming a metal pattern with which the damascene trench is filled, wherein the metal pattern is electrically connected to the interconnection contact and includes a substantially inclined bottom surface.

* * * * *